(12) United States Patent
Yang et al.

(10) Patent No.: US 7,508,976 B1
(45) Date of Patent: Mar. 24, 2009

(54) LOCAL PROCESS VARIATION CORRECTION FOR OVERLAY MEASUREMENT

(75) Inventors: Weidong Yang, Milpitas, CA (US); Roger R. Lowe-Webb, Sunnyvale, CA (US); Silvio J. Rabello, Palo Alto, CA (US)

(73) Assignee: Nanometric Incorporated, Milpitas, CA (US)

( * ) Notice: Subject to any disclaimer, the term of this patent is extended or adjusted under 35 U.S.C. 154(b) by 818 days.

(21) Appl. No.: 10/748,829

(22) Filed: Dec. 29, 2003

(51) Int. Cl.
*G06K 9/00* (2006.01)
(52) U.S. Cl. .................................. 382/151; 372/50.11
(58) Field of Classification Search .............. 382/151, 382/144, 145, 147, 149; 356/400; 438/32; 345/641; 372/50.11
See application file for complete search history.

(56) References Cited

U.S. PATENT DOCUMENTS

| | | | |
|---|---|---|---|
| 5,214,492 A | 5/1993 | LoBianco et al. | 356/400 |
| 5,216,257 A | 6/1993 | Brueck et al. | 250/548 |
| 5,307,152 A | 4/1994 | Boehnlein et al. | 356/376 |
| 5,559,601 A | 9/1996 | Gallatin et al. | 356/363 |
| 5,805,290 A | 9/1998 | Ausschnitt et al. | 356/401 |
| 5,969,819 A | 10/1999 | Wang | 356/371 |
| 6,077,756 A | 6/2000 | Lin et al. | 438/401 |
| 6,084,712 A | 7/2000 | Harding | 359/618 |
| 6,130,750 A | 10/2000 | Ausschnitt et al. | 356/401 |
| 6,407,396 B1 | 6/2002 | Mih et al. | 250/491.1 |
| 6,429,930 B1 | 8/2002 | Littaue et al. | 356/124 |
| 6,458,605 B1 * | 10/2002 | Stirton | 438/7 |
| 6,517,669 B2 * | 2/2003 | Chapman | 156/345.25 |
| 6,737,207 B2 * | 5/2004 | Imai | 430/30 |
| 6,780,550 B2 * | 8/2004 | Laughery et al. | 430/22 |
| 6,856,408 B2 * | 2/2005 | Raymond | 356/601 |
| 6,921,916 B2 * | 7/2005 | Adel et al. | 257/48 |
| 6,949,462 B1 | 9/2005 | Yang et al. | |

(Continued)

FOREIGN PATENT DOCUMENTS

WO         WO 01/84382 A1    11/2001

(Continued)

OTHER PUBLICATIONS

U.S. Appl. No. 10/116,863, filed Apr. 4, 2002, Weidong Yang.

(Continued)

*Primary Examiner*—Matthew C Bella
*Assistant Examiner*—Dennis Rosario
(74) *Attorney, Agent, or Firm*—Silicon Valley Patent Group LLP

(57) ABSTRACT

A diffraction based overlay metrology system produces the overlay error independent of effects caused by local process variations. Generally, overlay patterns include process variations that provide spectral contributions, along with the overlay shift, to the measured overlay error. The contributions from process variations are removed from the determined overlay error. In one embodiment, the local process variations are removed by measuring the overlay pattern before and after the top diffraction gratings are formed. A plurality of differential spectra from the measurement locations of the completed overlay pattern can then be used with a plurality of ratios of differential spectra from measurement locations of the incomplete overlay pattern can then be used to determine the overlay error by either direct calculation or by fitting techniques. In another embodiment, the local process variations are removed with no premeasurement but with careful construction of the overlay patterns.

17 Claims, 5 Drawing Sheets

U.S. PATENT DOCUMENTS

| | | | |
|---|---|---|---|
| 6,958,819 B1 | 10/2005 | Heaton et al. | |
| 6,970,255 B1 | 11/2005 | Spady et al. | |
| 6,982,793 B1 | 1/2006 | Yang et al. | |
| 6,992,764 B1 | 1/2006 | Yang et al. | |
| 7,009,704 B1* | 3/2006 | Nikoonahad et al. | 356/401 |
| 7,046,361 B1 | 5/2006 | Yang et al. | |
| 7,061,615 B1 | 6/2006 | Lowe-Webb | |
| 7,229,566 B2* | 6/2007 | Matsumoto et al. | 216/60 |
| 2002/0135875 A1 | 9/2002 | Niu et al. | 359/564 |
| 2002/0158193 A1 | 10/2002 | Sezginer et al. | 250/237 |
| 2003/0002043 A1 | 1/2003 | Abdulhalmin et al. | 356/400 |
| 2003/0042579 A1 | 3/2003 | Schulz | 257/629 |
| 2003/0043372 A1 | 3/2003 | Schulz | 356/327 |
| 2003/0043375 A1 | 3/2003 | Opsal | 356/369 |
| 2003/0044702 A1 | 3/2003 | Schulz | 430/30 |
| 2003/0223630 A1 | 12/2003 | Adel et al. | 382/145 |
| 2004/0101983 A1 | 5/2004 | Jones et al. | 438/14 |
| 2004/0169861 A1* | 9/2004 | Mieher et al. | 356/400 |

FOREIGN PATENT DOCUMENTS

| | | |
|---|---|---|
| WO | WO 02/25723 A2 | 3/2002 |
| WO | WO 02/065545 A2 | 8/2002 |
| WO | WO 02/069390 A2 | 9/2002 |
| WO | WO 02/084213 A1 | 10/2002 |
| WO | WO 2004/008068 A1 | 1/2004 |

OTHER PUBLICATIONS

U.S. Appl. No. 10/116,964, filed Apr. 4, 2002, Weidong Yang.
U.S. Appl. No. 10/116,798, filed Apr. 4, 2002, Weidong Yang.
U.S. Appl. No. 10/116,855, filed Apr. 4, 2002, John D. Heaton.
U.S. Appl. No. 10/261,547, filed Sep. 30, 2002, Weidong Yang.
U.S. Appl. No. 10/422,232, filed Apr. 23, 2003, Blaine R. Spady.
U.S. Appl. No. 09/960,892, filed Sep. 20, 2001, Roger R. Lowe-Webb.
Bischoff, J. et al., "Light Diffraction Based Overlay Measurement" *Proceedings of SPIE*, vol. 4344 (2001) pp. 222-233.
Michaelis, A. et al., "Spectroscopic Anitropy Micro-Ellipsometry (SAME) for determiation of lateral and vertical dimensions of sub-micron lithographic structures" IEEE Catalog No. 99TH8453 (1999) pp. 131-134.
NanoWave:Technology/development tools, http://www.nanowave.com/technology_applications/tech_devtoolsPR.html, 2 pages, downloaded Apr. 9, 2002.
NanoWave:Technology/how it works, http://www.nanowave.com/technology_applications/tech_HIWPR.html, 3 pages, downloaded Apr. 9, 2002.
NanoWave:Technology/product design, http://www.nanowave.com/technology_applications/tech_designPR.html, 4 pages, downloaded Apr. 9, 2002.
D.C. Flanders & Henry I. Smith, A new interferometric alignment technique[a)], Applied Physics Letters, vol. 31, No. 7, Oct. 1, 1977, pp. 426-428.

* cited by examiner

LOCAL PROCESS VARIATION CORRECTION FOR OVERLAY MEASUREMENT

FIELD OF THE INVENTION

The present invention relates to overlay metrology, and in particular to an overlay target and method of measurement that corrects for local process variations in the overlay error.

BACKGROUND

Semiconductor processing for forming integrated circuits requires a series of processing steps. These processing steps include the deposition and patterning of material layers such as insulating layers, polysilicon layers, and metal layers. The material layers are typically patterned using a photoresist layer that is patterned over the material layer using a photomask or reticle. Typically, the photomask has alignment targets or keys that are aligned to fiduciary marks formed in the previous layer on the substrate. However, as the size of integrated circuit features continues to decrease, it becomes increasingly difficult to measure the overlay accuracy of one masking level to the previous level. This overlay metrology problem becomes particularly difficult at submicrometer feature sizes where overlay alignment tolerances are reduced to provide reliable semiconductor devices.

One type of overlay measurement that has recently been developed is based on the diffraction of light by a number of alignment pads. FIG. 1 shows one example of a diffraction based overlay measurement pattern 10. As illustrated in FIG. 1, pattern 10 includes two separate alignment pads 20 and 30. The pads are made of the materials that are deposited onto the substrate. Each pad 20, 30 includes a bottom layer 12, a bottom diffraction grating 24, 34, a top layer 16, and a top diffraction grating 28, 38. The bottom layer 12 may be, e.g., one or more films on a substrate. The bottom diffraction gratings 24, 34 may be, e.g., metal lines surrounded by dielectric material. The top layer 16 may be, e.g., one or more films disposed over the substrate and the bottom diffraction grating material. The top diffraction gratings 28, 38 may be, e.g., metal lines, metal lines surrounded by dielectric material, photoresist lines, etc.

As illustrated in FIG. 1, the top diffraction gratings 28, 38 are intentionally offset from the bottom diffraction gratings 24, 34. In addition, the offsets of pads 20 and 30 are equal in magnitude but opposite in direction. With such an offset configuration, a misalignment to the left or right in FIG. 1 can be easily detected using pattern 10.

The diffraction based metrology pattern 10 relies on the symmetry of the alignment pads 20 and 30. When the symmetry is broken by an alignment error, the diffraction patterns produced by each alignment pad will change by different amounts. FIG. 2, by way of example, illustrates metrology pattern 10 with an alignment error to the right in the figure, which as can be seen, creates an asymmetry between the pads 20 and 30. By comparing the diffraction patterns from pads 20 and 30, the amount of alignment error can be determined.

In the presence of local process variations, however, diffraction based overlay measurement may be biased. Local process variations are created during processing of the measurement pattern 10, e.g., during chemical mechanical polishing, and result in differences in film thickness, grating height or grating linewidth. Local process variations may cause an asymmetry between the alignment pads 20 and 30 even if there is no alignment error. Accordingly, when there is an alignment error, the difference in collected spectra from pads 20 and 30 contains information from both the overlay shift and the process variations. These contributions cannot be directly separated.

Thus, what is needed is an improved diffraction based metrology technique that can correct for local process variations when measuring the overlay error.

SUMMARY

A diffraction based overlay metrology method and apparatus, in accordance with the present invention, determines overlay error independent of local process variations. The contributions from process variations are removed by measuring the overlay pattern before and after the top diffraction gratings are formed. A plurality of differential spectra from the measurement locations of the completed overlay pattern can then be used with a plurality of ratios of differential spectra from measurement locations of the incomplete overlay pattern to determine the overlay error by either direct calculation or by fitting techniques.

In one embodiment of the present invention, a method of measuring an overlay error that is corrected for process variations includes producing an incomplete overlay pattern, which has a plurality of measurement locations. The incomplete overlay pattern has a diffraction grating at each measurement location. The plurality of measurement locations of the incomplete overlay pattern are illuminated with incident radiation that reacts with the diffraction gratings and the resulting radiation is then detected. The overlay pattern is then completed by forming top diffraction gratings over the previously formed bottom diffraction gratings. The top diffraction gratings are formed with a designed in offset from the bottom diffraction gratings, i.e., the top and bottom diffraction gratings are intentionally offset by a known amount when there is no overlay error. The plurality of measurement locations are then illuminated again with incident radiation and the resulting radiation is detected. The detected radiation from the plurality of measurement locations of the incomplete overlay pattern and the detected radiation from the plurality of measurement locations of the completed overlay pattern are then used to determine the overlay error. In one embodiment, the detected radiation from the incomplete overlay pattern and the detected radiation from the completed overlay pattern are used to generate a plurality of ratios of differential spectra from measurement locations of the incomplete overlay pattern and a plurality of differential spectra from measurement locations of the completed overlay pattern. The plurality of ratios and the plurality of differential spectra are then used to determine the overlay error, e.g., by direct calculation or by fitting.

Another embodiment of the present invention is a method of determining the overlay error, which is corrected for process variations, in an overlay pattern having a plurality of measurement locations, each measurement location having a bottom diffraction grating and a top diffraction grating, each top diffraction grating overlies a corresponding bottom diffraction grating and has a designed in offset, wherein a plurality of measurement locations have different designed in offsets. The method includes generating a first plurality of differential spectra, the spectra being measured from measurement locations of the overlay pattern prior to producing the top diffraction gratings and generating a second plurality of differential spectra, the spectra being measured from measurement locations of the overlay pattern after producing the top diffraction gratings. The first plurality of differential spectra and the second plurality of differential spectra are then used to determine the overlay error. In one embodiment, the first plurality of differential spectra is used to generate a plurality of ratios of differential spectra that are used to determine the overlay error along with the second plurality of differential spectra.

Another embodiment includes an apparatus for determining overlay error that is corrected for process variations in an overlay pattern having a plurality of measurement locations, each measurement location having a bottom diffraction grating and a top diffraction grating, each top diffraction grating overlies a corresponding bottom diffraction grating and has a designed in offset, wherein a plurality of measurement locations have different designed in offsets. The apparatus includes a radiation source for producing radiation to be incident on the plurality of measurement locations of the overlay pattern and a detector for detecting the spectra after the radiation interacts with the measurement locations of overlay pattern. The apparatus also includes a computer and a computer-usable medium having computer-readable program code embodied therein for causing the computer to perform the acts of generating a first plurality of differential spectra, the spectra being detected from measurement locations of the overlay pattern prior to producing the top diffraction gratings and generating a second plurality of differential spectra, the spectra being detected from measurement locations of the overlay pattern after producing the top diffraction gratings. The first plurality of differential spectra and the second plurality of differential spectra are then used to determine the overlay error. In one embodiment, the computer-readable program code further causes the computer to perform the act of generating a plurality of ratios of differential spectra using the first plurality of differential spectra and using the plurality of ratios to determine the overlay error along with the second plurality of differential spectra.

Another aspect of the present invention includes a method that includes providing an overlay pattern having a plurality of measurement locations, each measurement location includes a bottom diffraction grating and a top diffracting grating that overlies the bottom diffraction grating and has a designed in offset from the bottom diffraction grating. The plurality of measurement locations are illuminated with incident radiation that reacts with the diffraction gratings and the radiation is detected after reacting with the diffraction gratings. The overlay error between the bottom diffraction gratings and the top diffraction gratings is determined using the detected radiation from the measurement locations from the overlay pattern, and the overlay error is corrected for effects of local process variations created during processing of the overlay pattern using the detected radiation from at least one pair of the measurement locations from the overlay pattern. In one embodiment, the method includes illuminating the plurality of locations before completing the overlay pattern, i.e., illuminating each location of the incomplete overlay pattern, and detecting the radiation. Determining the overlay error and correcting the overlay error are performed using the detected radiation from both the complete and incomplete overlay pattern. In another embodiment, the overlay pattern includes at least a first pair of the measurement locations have a designed in offset of a first magnitude and at least a second pair of the measurement locations have a designed in offset of a second magnitude, where the correcting the overlay error uses the detected radiation from the first pair of measurement locations. The embodiment may further include using the second pair of measurement locations to correct the overlay error. The first pair may have designed in offsets in equal or opposite directions and the second pair has designed in offsets in the opposite directions. In one embodiment, correcting the overlay error for effects of local process variations created during processing of the overlay pattern is performed while determining the overlay error.

In another aspect of the present invention, a method includes providing an overlay pattern having at least four measurement locations, each measurement location having a bottom diffraction grating and a top diffracting grating that overlies the bottom diffraction grating and has a designed in offset from the bottom diffraction grating, at least two pairs of the measurement locations have the same magnitude designed in offset. The method includes illuminating each of the measurement locations of the overlay pattern with incident radiation that reacts with the diffraction gratings and detecting the radiation from the measurement locations after reacting with the diffraction gratings. The overlay pattern is determined using the detected radiation from the measurement locations, and the overlay error is corrected for effects of local process variations using the detected radiation from at least one pair of the measurement locations from the overlay pattern. In one embodiment, correcting the overlay error for effects of local process variations created during processing of the overlay pattern is performed while determining the overlay error.

DETAILED DESCRIPTION

A diffraction based overlay metrology method corrects the effects caused by local process variations in accordance with the present invention. In general, diffraction based overlay measurements include contributions from both the overlay shift as well as process variations in the formation of the overlay pattern. By removing the effects of the process variations, the accuracy of the measurement of the overlay error is increased.

Figure 1:
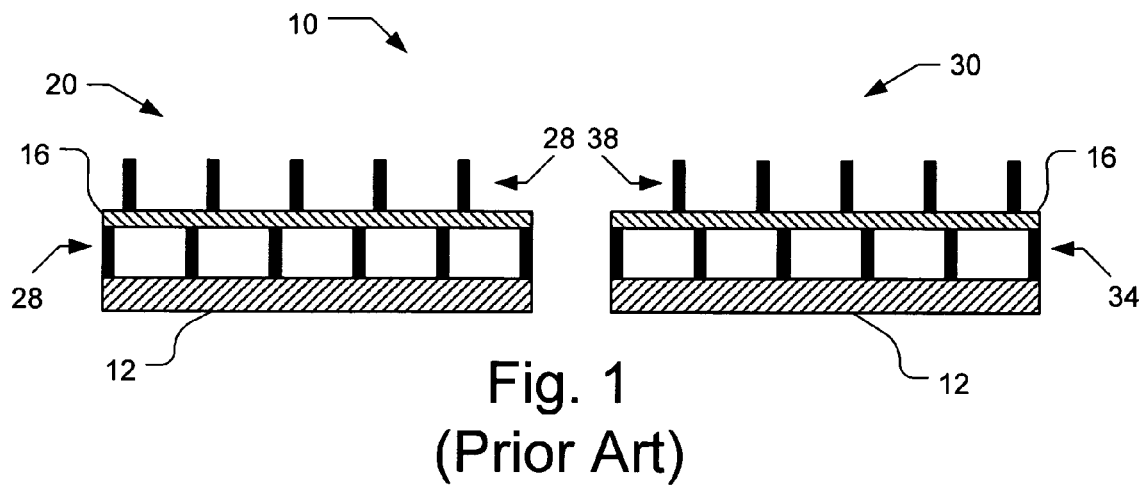
FIG. 1 shows one example of a diffraction based overlay measurement pattern.
Figure 2:
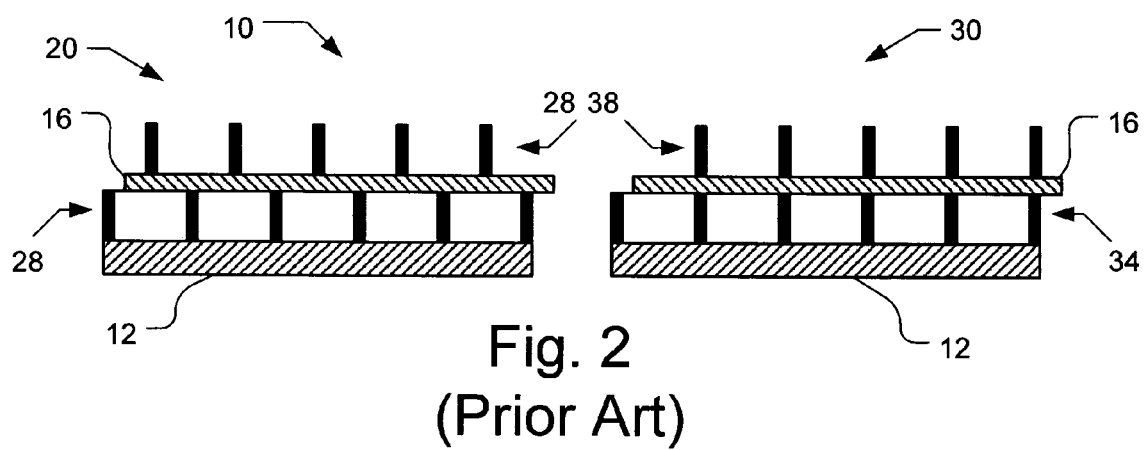
FIG. 2 illustrates the metrology pattern of FIG. 1 with an alignment error.
Figure 3:
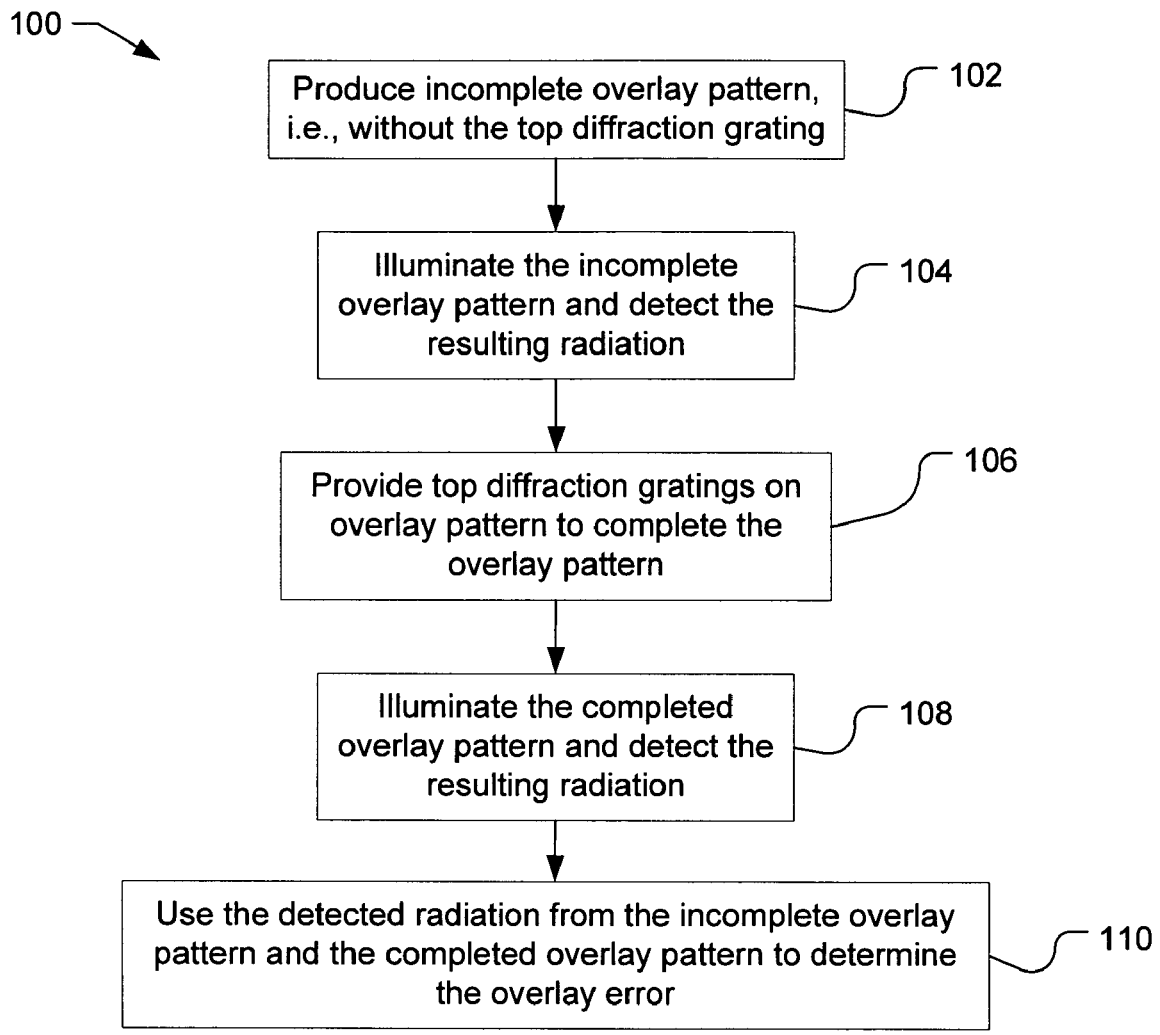
FIG. 3 is a flow chart illustrating an embodiment of the present invention of measuring an overlay error that is corrected for any process variations from the fabrication of the overlay pattern.

FIG. 3 is a flow chart 100 illustrating an embodiment of the process of measuring an overlay error that is corrected for any process variations from the fabrication of the overlay pattern. The method, in accordance with an embodiment of the present invention, includes measuring diffracted radiation from the overlay pattern before and after the top diffraction grating is produced and using the measured diffracted radiation to determine the overlay error, which is corrected for process variations. Thus, as illustrated in FIG. 3, in step 102 an incomplete overlay pattern is produced, i.e., the overlay pattern is produced without the top diffraction gratings.

Figure 4:
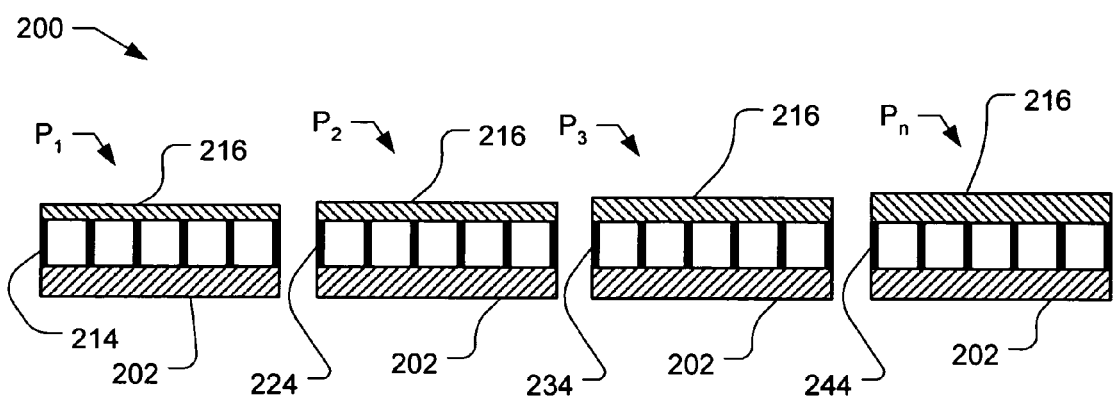
FIG. 4 is a side view of one embodiment of an incomplete overlay pattern, i.e., an overlay pattern without the top diffraction gratings formed.

FIG. 4 is a side view of one embodiment of an incomplete overlay pattern 200. Overlay pattern 200 includes a plurality of measurement locations, sometimes referred to herein as grating pads $P_1, P_2, P_3 \ldots P_n$, where n represents the number of the last pad. While FIG. 4 shows four pads, it should be understood that additional pads may be used if desired.

Each grating pad includes a bottom layer 202, a bottom diffraction grating 214, 224, 234, and 244, and a top layer 216. As can be seen in FIG. 4, the top layer 216 varies in thickness from one pad to the next. The variation in the thickness of the top layer 216 is an example of local process variations, for which the present invention compensates. The variation in the thickness of the top layer 216 from one pad to the next may be caused by, e.g., chemical mechanical polishing.

As is well understood, the bottom layer 202 may be one or more layers on a substrate or the substrate itself. The bottom diffraction gratings are produced from the materials that are deposited on the substrate at that level and may be, e.g., metal lines surrounded by dielectric material or any other appropriate material. The bottom diffraction gratings 214, 224, 234, 244 have the same parameters, e.g., line height, line width, and pitch. The top layer 216 may be, e.g., one or more films disposed over the substrate and the bottom diffraction grating material. Preferably, the incomplete overlay pattern 200 is as close to complete as possible, but without the top diffraction gratings formed. For example, in one embodiment where the material for the top diffraction gratings is transparent or partially transparent, the material for the top diffraction gratings may be deposited, but not etched, over top layer 216. The processing steps of depositing films and etching patterns in the films is well known in the art.

Referring back to FIG. 3, in step 104 the incomplete overlay pattern 200 is illuminated and the resulting radiation is detected from each grating pad $P_1, P_2, P_3 \ldots P_n$. For example, the diffracted spectra may be measured after the incident radiation interacts with the bottom diffraction grating (as well as the top layer 216 and bottom layer 202).

Figure 5:
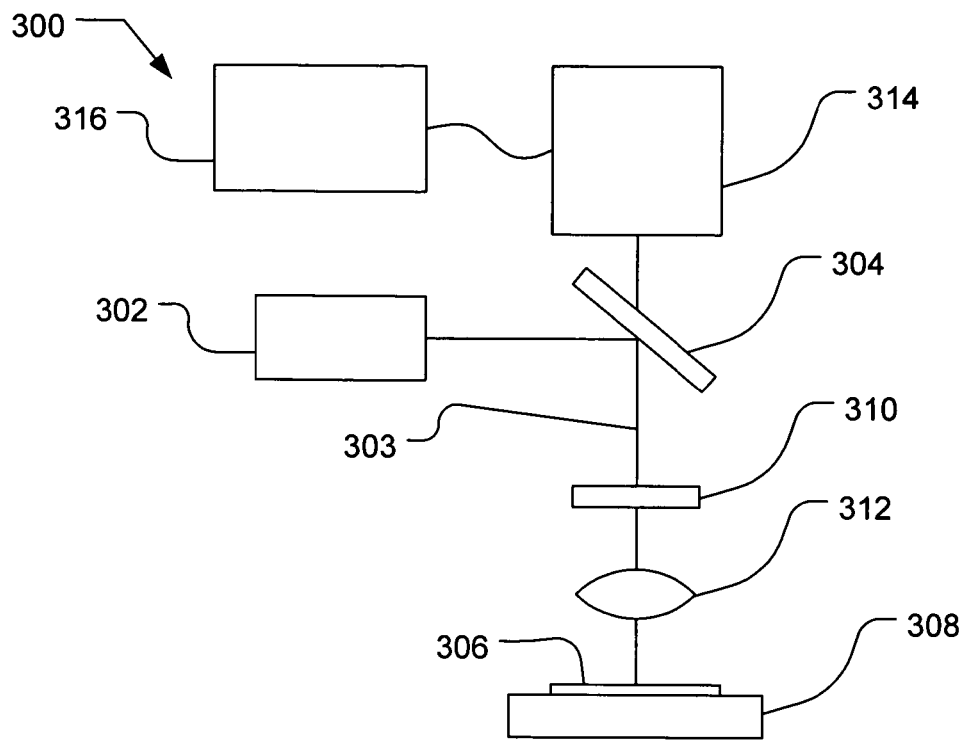
FIG. 5 illustrates a normal incidence polarized reflectance spectrometer that may be used to measure the overlay pattern.

The measurement of the spectra may be performed using a reflectometer, ellipsometer, scatterometer or any other appropriate instrument. By way of example, FIG. 5 illustrates a normal incidence polarized reflectance spectrometer 300 that may be used to measure a pattern 100. Spectrometer 300 is discussed in detail in the U.S. patent application entitled "Apparatus and Method for the Measurement of Diffracting Structures," filed Sep. 25, 2000, having Ser. No. 09/670,000, which has the same assignee as the present disclosure and is incorporated herein by reference.

As shown in FIG. 5, spectrometer 300 is similar to a reflectometer, which is well known in the art. Spectrometer 300 includes a polychromatic light source 302 that generates a light beam that is partially reflected by beam splitter 304 along the optical axis 303. The light beam is directed towards a sample 306 having an overlay pattern, such as pattern 200, to be measured. Sample 306 may be, e.g., a semiconductor wafer or flat panel display or any other substrate, and is supported by a stage 308, which may be a polar coordinate, i.e., R-θ, stage or an x-y translation stage. Spectrometer 300 includes a rotatable polarizer 310 and a lens 312 (or series of lenses) to polarize and focus the light beam onto the sample 306 at normal incidence. The beam is reflected off sample 306 and the reflected light is transmitted through lens 312 and polarizer 310. A portion of the reflected light is transmitted through beam splitter 304 and is received by a spectrophotometer 314. Spectrophotometer 314 is coupled to processor 316, which analyzes the data provided by spectrophotometer 314. Processor 316 is e.g., a computer with a computer-usable medium having computer-readable program code embodied therein for causing the computer to determine the overlay error based on the light that is diffracted from the overlay pattern as will be described herein. One of ordinary skill in the art can program code capable of determining the overlay error that is corrected for local variations in accordance with the present invention in view of the present disclosure. For more information on the general operation of a normal incidence polarized reflectance spectrometer, the reader is referred to Ser. Nos. 09/670,000, which is incorporated herein by reference.

Because the top diffraction gratings have not been formed on pads $P_1, P_3 \ldots P_n$, the pads should be identical in the present embodiment, except for any local process variations, illustrated in FIG. 4 as the variation in thickness of the top layer 116 from one pad to the next. Thus, differences in the detected radiation, e.g., spectra, from each pad in overlay pattern 200 are caused by process variations.

Figure 6:
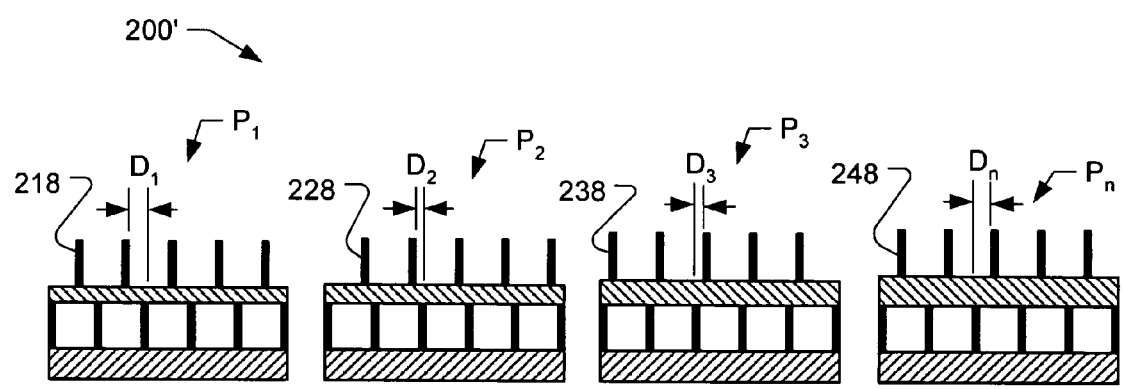
FIG. 6 is a side view of one embodiment of a completed overlay pattern, i.e., an overlay pattern with the top diffraction gratings formed with designed in offsets.

After the incomplete overlay pattern 200 is measured in step 104 of FIG. 3, the overlay pattern 200 is then completed by fabricating the top diffraction gratings (step 106). The completed overlay pattern 200' is shown in FIG. 6. The completed overlay pattern 200' is the same as incomplete overlay pattern 200 (shown in FIG. 4), but with the addition of the top diffraction gratings 218, 228, 238, and 248 on pads $P_1, P_2, P_3, P_n$ respectively. The top diffraction gratings 218, 228, 238, and 248 are produced such that they are intentionally offset by a known amount from the corresponding bottom diffraction gratings when there is no overlay error. This intentional offset is referred to herein as a designed in offset.

As illustrated in FIG. 6, the pads $P_1, P_2, P_3 \ldots P_n$ have designed in offsets $D_1, D_2, D_3 \ldots D_n$ between the top and bottom diffraction gratings. The designed in offsets may be different for each pad $P_1, P_2, P_3 \ldots P_n$. In some embodiments, some of the pads may have equal but opposite designed in offsets, i.e., the offsets have the same magnitude but opposite signs, e.g., $D_2=-D_3$. Further, in some embodiments, some of the designed in offsets may be identical, e.g., $D_2=D_4$.

Typically, during the fabrication of the layer that includes the top diffraction gratings, there is an overlay error which is caused, e.g., by improper alignment between the mask and the underlying gratings. The overlay error is, thus, evidenced by a change in the alignment of the top diffraction gratings with the bottom diffraction gratings. The overlay error e is the same for each of the pads in the overlay pattern. The resulting total overlay shift $O_1, O_2, O_3 \ldots O_n$ for each pad is, thus, equal to the designed in offset plus the overlay error e, $D_1+e, D_2+e, D_3+e \ldots D_n+e$.

It should be understood that FIG. 6 illustrates an overlay pattern 200' that can be used to measure the overlay error in one direction, i.e., parallel with the page. An additional overlay pattern that is orthogonal to overlay pattern 200' would be used to measure the overlay error in another direction, i.e., perpendicular to the page. If desired, a single overlay pattern that uses bi-directional gratings may be used in accordance with the present invention.

Once the overlay pattern 200' is completed, the overlay pattern 200' is then illuminated and the resulting radiation is detected from each grating pad $P_1, P_2, P_3 \ldots P_n$ in step 108 of FIG. 3. As described in reference to step 104, the diffracted spectra may be measured from each pad. The resulting radiation that is detected includes contributions from any process variations as well as the overlay shift, which includes the designed in offset and the overlay error.

As shown in step 110 of FIG. 3, the detected radiation from the incomplete overlay pattern 200 and the detected radiation from the completed overlay pattern 200' are then used together to determine the overlay error, which is independent of process variations. The overlay error is corrected for process variations by using the detected radiation from the incomplete overlay pattern 200, which includes contributions from process variations alone, and using the detected radiation from the completed overlay pattern 200', which includes contributions from both the process variations and the overlay shift.

Figure 7:
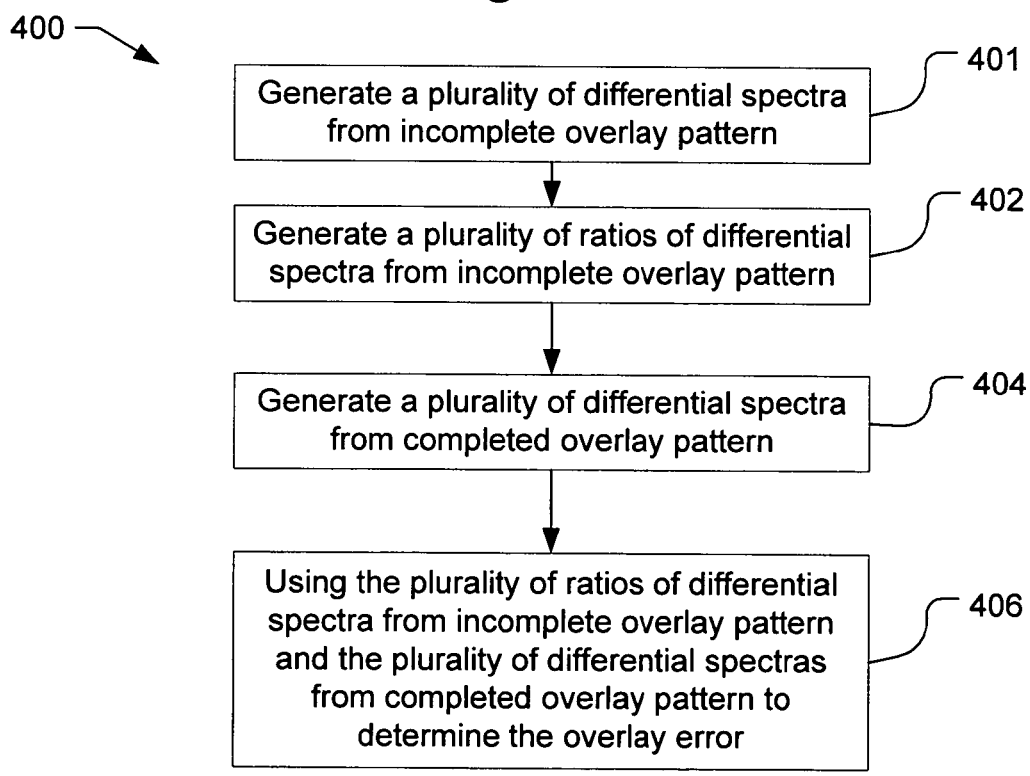
FIG. 7 is a flow chart that illustrates using the detected radiation from the incomplete overlay pattern and the detected radiation from the completed overlay pattern to determine the overlay error.

FIG. 7 is a flow chart 400 that illustrates using the detected radiation from the incomplete overlay pattern 200 and the detected radiation from the completed overlay pattern 200' to determine the overlay error. As shown in step 401, a plurality of differential spectra from the incomplete overlay pattern is generated. The differential spectra from the pads of the incomplete overlay pattern 200 have the following relationships:

$$S_i - S_j = P(E_i - E_j) \qquad \text{eq. 1}$$

$$S_k - S_l = P(E_k - E_l) \qquad \text{eq. 2}$$

where i, j, k, and l are integers representing the number of the measured pad, S represents the spectra measured from a pad of incomplete overlay pattern 200, E represents the parametrical process variation of the measured pad, and P represents the unit spectral contribution from processing before forming of the top diffraction gratings. A plurality of ratios of differential spectra from the incomplete overlay pattern can be generated (step 402), as follows:

$$\frac{S_i - S_j}{S_k - S_l} = \frac{E_i - E_j}{E_k - E_l}. \qquad \text{eq. 3}$$

A plurality of differential spectra from the completed overlay pattern 200' is generated in step 404 in FIG. 7. The spectra from the pads of the completed overlay pattern 200' have the following relationship:

$$T_i - T_j = Q(E_i - E_j) + Ovl(O_i - O_j) \qquad \text{eq. 4}$$

where T represents the spectra measured from a pad of completed overlay pattern 200', O represents the total overlay shift of the measured pad, Q represents the unit spectral contribution from processing after forming of the top diffraction gratings, and Ovl represents the unit spectral contribution from the overlay shift.

Using the plurality of ratios of the differential spectra from the incomplete overlay pattern 200 and the plurality of differential spectra from the completed overlay pattern 200', the overlay error e can be determined corrected for process variations (step 406). In one embodiment, the overlay error e is determined by direct calculation using the measured spectra from the incomplete overlay pattern 200 and the completed overlay patter 200', as well as the known designed in offsets. In another embodiment, the overlay error e is determined by curve fitting the differential spectra.

In one embodiment, in which the overlay error can be directly calculated based on the measured radiation, two of the pads $P_i$ and $P_j$ have the same designed in offset and therefore the same total overlay shift. Table 1 shows an example of the present embodiment.

TABLE 1

|  | Pad 1 | Pad 2 | Pad 3 | Pad 4 |
|---|---|---|---|---|
| Designed in Offset | −D | +D | D + d | +D |
| Total Overlay Shift | −D + e | D + e | D + d + e | D + e |
| Parametrical process variation | $E_1$ | $E_2$ | $E_3$ | $E_4$ |
| Spectra (Before Top Gratings) | $S_1$ | $S_2$ | $S_3$ | $S_4$ |
| Spectra (After Top Gratings) | $T_1$ | $T_2$ | $T_3$ | $T_4$ |

The term D represents the magnitude of the offset and the term d represents the magnitude of a reference offset. In general, the offset D, may be 5% to 40% of the pitch, and more particularly 25%, while the reference offset d can be 1% to 15% of the pitch, e.g., 5% of the pitch. However, if the reference offset d is too small, the reference offset d will be lost in the noise, while if too large, the reference offset may lose linearity.

From equation 3 above, in the present embodiment, the spectra from the pads before the top diffraction gratings are formed have the following relationships:

$$\frac{S_4 - S_2}{S_3 - S_2} = \frac{E_4 - E_2}{E_3 - E_2} \qquad \text{eq. 5}$$

$$E_3 - E_2 = (E_4 - E_2)\frac{S_3 - S_2}{S_4 - S_2}. \qquad \text{eq. 6}$$

From equation 4 above, the spectral difference between pads can be calculated, where spectral difference between pads 2 and 4 (after the top diffraction gratings are formed) will contain contributions only from process variations because the total overlay shift O of the two pads are the same.

$$T_4 - T_2 = Q(E_4 - E_2) \qquad \text{eq. 7}$$

The spectral difference between any other combinations of pads, however, will contain information relating to both the process variations and the overlay shift, e.g., $$T_3 - T_2 = Q(E_3 - E_2) + d*Ovl. \qquad \text{eq. 8}a$$

Equation 8a can be rewritten, using equation 6, as:

$$T_3 - T_2 = Q(E_4 - E_2)\frac{S_3 - S_2}{S_4 - S_2} + d*Ovl \qquad \text{eq. 8}$$

$$= (T_4 - T_2)\frac{S_3 - S_2}{S_4 - S_2} + d*Ovl.$$

The term d*Ovl is a reference spectra and may be written as a function of measured spectral values as:

$$d*Ovl = (T_3 - T_2) - (T_4 - T_2)\frac{S_3 - S_2}{S_4 - S_2}. \qquad \text{eq. 9}$$

The reference spectra can be used to determine the overlay error e once the spectra from the overlay error is also determined. To determine the spectra from the overlay error, the spectral relation between, e.g., pads 1 and 2 may be analyzed. As indicated above in Table 1, the total overlay shift (designed in offsets plus overlay error) for pads 1 and 2 is −D+e, and D+e, respectively. Due to symmetry, the spectrum acquired from pad 1 with offset −D+e is equivalent to a spectrum acquired from a pad with shift +D−e; that is, the relative offsets of pads 1 and 2 becomes D+e−(−D+e)≡D+e−(+D−e) =2e. The spectral relations of pads 1 and 2 can be written as follows.

$$S_2 - S_1 = P(E_2 - E_1) \qquad \text{eq. 10}$$

$$T_2 - T_1 = Q(E_2 - E_1) + 2e * Ovl \qquad \text{eq. 11}$$

$$= Q(E_4 - E_2)\frac{S_2 - S_1}{S_4 - S_2} + 2e * Ovl$$

$$= (T_4 - T_2)\frac{S_2 - S_1}{S_4 - S_2} + 2e * Ovl$$

The term 2e*Ovl is the error spectra, which may be written as a function of measured spectral values as:

$$2e * Ovl = (T_2 - T_1) - (T_4 - T_2)\frac{S_2 - S_1}{S_4 - S_2} \qquad \text{eq. 12}$$

Combining the overlay error spectra from equation 12 with the reference spectra from equation 9 produces:

$$\frac{2e}{d} = \frac{(T_2 - T_1) - (T_4 - T_2)\frac{S_2 - S_1}{S_4 - S_2}}{(T_3 - T_2) - (T_4 - T_2)\frac{S_3 - S_2}{S_4 - S_2}}. \qquad \text{eq. 13}$$

Accordingly, the overlay error e is found to be:

$$e = \frac{d}{2} * \frac{(T_2 - T_1) - (T_4 - T_2)\frac{S_2 - S_1}{S_4 - S_2}}{(T_3 - T_2) - (T_4 - T_2)\frac{S_3 - S_2}{S_4 - S_2}} \qquad \text{eq. 14}$$

As can be seen in equation 14, the overlay error e can be written as a function of the spectra measured from the pads before and after the top diffraction grating is formed and as a function of the designed in overlay shift d. Thus, the overlay error e can be determined using the plurality of differential spectra from the incomplete overlay pattern 200 (or a plurality of the ratio of differential spectra) and a plurality of differential spectra from the completed overlay pattern 200' as provided in equation 14 (step 406 in FIG. 7).

It should be understood that the subscripts herein can be generalized to any of the pads if desired. It should also be understood that, while the present embodiment is described with pads 1 and 2 having designed in offsets of equal but opposite magnitudes, the pads 1 and 2 may have designed in offsets of different magnitudes if desired. Further, additional pads may be used and additional or different ratios may be used. Useful ratios and pad configurations that may be used with the present embodiment are discussed in U.S. Ser. No. 10/116,863, which is incorporated herein.

In another embodiment of the present invention, the overlay error e may be corrected from local process variations in the overlay pattern without the use of pads that have the identical designed in offsets, i.e., pads 4 and 2 do not have the same designed in offsets in Table 1. Table 2 below describes one example of such an embodiment.

TABLE 2

| Pad: | $P_1$ | $P_2$ | $P_3$ | $P_4$ |
|---|---|---|---|---|
| Designed Offset | −D − d | −D | D | D + d |
| Offset with Error | −D − d + e | −D + e | D + e | D + d + e |
| Process | $E_1$ | $E_2$ | $E_3$ | $E_4$ |
| Spectra, no top grating | $S_1$ | $S_2$ | $S_3$ | $S_4$ |
| Spectra, with top grating | $T_1$ | $T_2$ | $T_3$ | $T_4$ |

Using the description provided in Table 2, the spectra from the pads, before the top diffraction gratings are formed, may be written as follows, where b is a constant representing the spectrum when there is no process shift.

$$S_1 = E_1 P + b$$

$$S_2 = E_2 P + b$$

$$S_3 = E_3 P + b$$

$$S_4 = E_4 P + b \qquad \text{eq. 15}$$

As stated above:

$$\frac{S_i - S_j}{S_m - S_n} = \frac{E_i - E_j}{E_m - E_n} \qquad \text{eq. 16}$$

where i, j, m, and n are integers representing the pad numbers, e.g., from 1 to 4.

The spectra from the pads described in Table 2, after the top diffraction gratings are formed, may be written as follows, where c is a constant representing the spectrum when there is no process contribution to the spectrum.

$$T_1 = (d-e)Ovl + E_1 Q + c$$

$$T_2 = -eOvl + E_2 Q + c$$

$$T_3 = eOvl + E_3 Q + c$$

$$T_4 = (d+e)Ovl + E_4 Q + c \qquad \text{eqs. 17}$$

Using the values from equation 17, a plurality of differential spectra $T_i - T_j$ may be written as follows.

$$T_1 - T_2 = dOvl + (E_1 - E_2)Q$$

$$T_4 - T_3 = dOvl + (E_4 - E_3)Q$$

$$T_4 - T_1 = 2eOvl + (E_4 - E_1)Q$$

$$T_3 - T_2 = 2eOvl + (E_3 - E_2)Q \qquad \text{eqs. 18}$$

Using the above equations, the overlay error e can be determined by either direct calculation or by fitting. By way of example, in one embodiment, the overlay error e can be directly calculated by deriving a ratio of the overlay error e versus the reference offset d. This embodiment is particularly useful when the process variation is significant and the spectral difference is detectable before the top gratings are formed.

Combining a ratio from equation 16 with one of the differential spectra values in equation 18, e.g., $T_4 - T_3$, produces:

$$(T_4 - T_3)\frac{S_1 - S_2}{S_4 - S_3} = dOvl\frac{S_1 - S_2}{S_4 - S_3} + (E_4 - E_3)\frac{S_1 - S_2}{S_4 - S_3}Q \qquad \text{eqs. 19}$$

-continued $$(T_4 - T_3)\frac{S_1 - S_2}{S_4 - S_3} = dOvl\frac{S_1 - S_2}{S_4 - S_3} + (E_4 - E_3)\frac{E_1 - E_2}{E_4 - E_3}Q$$

$$(T_4 - T_3)\frac{S_1 - S_2}{S_4 - S_3} = dOvl\frac{S_1 - S_2}{S_4 - S_3} + (E_1 - E_2)Q.$$

By substituting in the differential spectra value $T_1-T_2$ from equations 18 into equation 19, the following is obtained.

$$(T_4 - T_3)\frac{S_1 - S_2}{S_4 - S_3} - (T_1 - T_2) = dOvl\left(\frac{S_1 - S_2}{S_4 - S_3} - 1\right) \qquad \text{eq. 20}$$

Similarly, using the differential spectra values $T_4-T_1$ from equation 18 and a ratio from equation 16 produces:

$$(T_4 - T_1)\frac{S_3 - S_2}{S_4 - S_1} = 2eOvl\frac{S_3 - S_2}{S_4 - S_1} + (E_3 - E_2)Q. \qquad \text{eq. 21}$$

By substituting in the differential spectra value $T_3-T_2$ from equation 18 into equation 21, the following is obtained.

$$(T_4 - T_1)\frac{S_3 - S_2}{S_4 - S_1} - (T_3 - T_2) = 2eOvl\left(\frac{S_3 - S_2}{S_4 - S_1} - 1\right). \qquad \text{eq. 22}$$

Using equations 20 and 22, a ratio of the overlay error e to the reference offset d, i.e., e/d, can be generated with no unknown terms. Accordingly, the overlay error e may be written as the following.

$$e = \frac{d}{2} * \frac{\left(\frac{S_1 - S_2}{S_4 - S_3} - 1\right)}{\left(\frac{S_3 - S_2}{S_4 - S_1} - 1\right)} \cdot \frac{(T_3 - T_2) - (T_4 - T_1)\frac{S_3 - S_2}{S_4 - S_1}}{(T_1 - T_2) - (T_4 - T_3)\frac{S_1 - S_2}{S_4 - S_3}}. \qquad \text{eq. 23}$$

Thus, the overlay error e can be directly calculated (step 406 in FIG. 7) using a plurality of differential spectra from the measurement locations of the completed overlay pattern 200' (step 404 in FIG. 7), a plurality of ratios of differential spectra from measurement locations of the incomplete overlay pattern 200 (step 402 in FIG. 7), and the reference offset d.

In another embodiment of directly calculating the overlay error e, the spectral contribution from the processing variations Q and the spectral contribution from the overlay shift Ovl are assumed to be orthogonal or near orthogonal, which can be expressed as:

$$\frac{\left(\sum_i (Q_i \times Ovl_i)\right)^2}{\left(\sum_i Q_i^2\right)\left(\sum_i Ovl_i^2\right)} \ll 1. \qquad \text{eq. 24}$$

Using the following differential spectra terms from equations 18:

$$T_1-T_2=dOvl+(E_1-E_2)Q$$

$$T_4-T_3=dOvl+(E_4-E_3)Q \qquad \text{eq. 25}$$

the spectral contribution Q from processing variations can be written as:

$$T_1-T_2+T_3-T_4=(E_1-E_2+E_3-E_4)Q \qquad \text{eq. 26}$$

The reference spectra dOvl, i.e., the spectra associated with the reference offset d, can be determined using the differential spectra $T_1$-$T_2$ from equation 18.

$$T_1 - T_2 = dOvl + (E_1 - E_2)Q \qquad \text{eq. 27}$$
$$= dOvl + \frac{E_1 - E_2}{E_1 - E_2 + E_3 - E_4}(E_1 - E_2 + E_3 - E_4)Q$$
$$= dOvl + \frac{S_1 - S_2}{S_1 - S_2 + S_3 - S_4}(E_1 - E_2 + E_3 - E_4)Q$$

$$dOvl = (T_1 - T_2) - \frac{S_1 - S_2}{S_1 - S_2 + S_3 - S_4}(E_1 - E_2 + E_3 - E_4)Q \qquad \text{eq. 28}$$

By inserting equation 26 into equation 28, the reference spectra dOvl can be derived using measured spectra as:

$$dOvl = (T_1 - T_2) - \frac{S_1 - S_2}{S_1 - S_2 + S_3 - S_4}(T_1 - T_2 + T_3 - T_4). \qquad \text{eq. 29}$$

The error spectra 2eOvl, i.e., the spectra associated with the offset error e, can then be found in a similar manner, using the differential spectra $T_3$-$T_2$ as follows:

$$T_1 - T_2 = 2eOvl + (E_3 - E_2)Q \qquad \text{eq. 30}$$
$$= 2eOvl + \frac{E_3 - E_2}{E_1 - E_2 + E_3 - E_4}(E_1 - E_2 + E_3 - E_4)Q$$
$$= 2eOvl + \frac{S_3 - S_2}{S_1 - S_2 + S_3 - S_4}(E_1 - E_2 + E_3 - E_4)Q$$

$$2eOvl = (T_3 - T_2) - \frac{S_3 - S_2}{S_1 - S_2 + S_3 - S_4}(E_1 - E_2 + E_3 - E_4)Q \qquad \text{eq. 31}$$

Inserting equation 26 into equation 31, produces the error spectra 2eOvl as a function of measured spectra.

$$2eOvl = (T_3 - T_2) - \frac{S_3 - S_2}{S_1 - S_2 + S_3 - S_4}(T_1 - T_2 + T_3 - T_4) \qquad \text{eq. 32}$$

By analyzing the ratio of equations 32 and 29, the overlay error e can be solved directly as follows.

$$e = \frac{d}{2} * \frac{(T_3 - T_2) - \frac{S_3 - S_2}{S_1 - S_2 + S_3 - S_4}(T_1 - T_2 + T_3 - T_4)}{(T_1 - T_2) - \frac{S_1 - S_2}{S_1 - S_2 + S_3 - S_4}(T_1 - T_2 + T_3 - T_4)} \qquad \text{eq. 33}$$

Thus, again, the overlay error e is directly calculated (step 406 in FIG. 7) using a plurality of differential spectra from the measurement locations of the completed overlay pattern 200' (step 404 in FIG. 7), a plurality of ratios of differential spectra from measurement locations of the incomplete overlay pattern 200 (step 402 in FIG. 7), and the reference offset d.

It should be understood, of course, the overlay error e may be directly calculated from equivalent expressions to those provided above. The overlay pattern may use additional pads and/or different configurations, including different designed in offsets than those provided in Table 2. Further, the overlay error e may calculated using other types of ratios such as those discussed in U.S. Ser. No. 10/116,863, which is incorporated herein. Nevertheless, in order to correct for process variations, the expression of the overlay error e uses a plurality of differential spectra from the measurement locations of the completed overlay pattern 200', a plurality of ratios of differential spectra from measurement locations of the incomplete overlay pattern 200.

Figure 8:
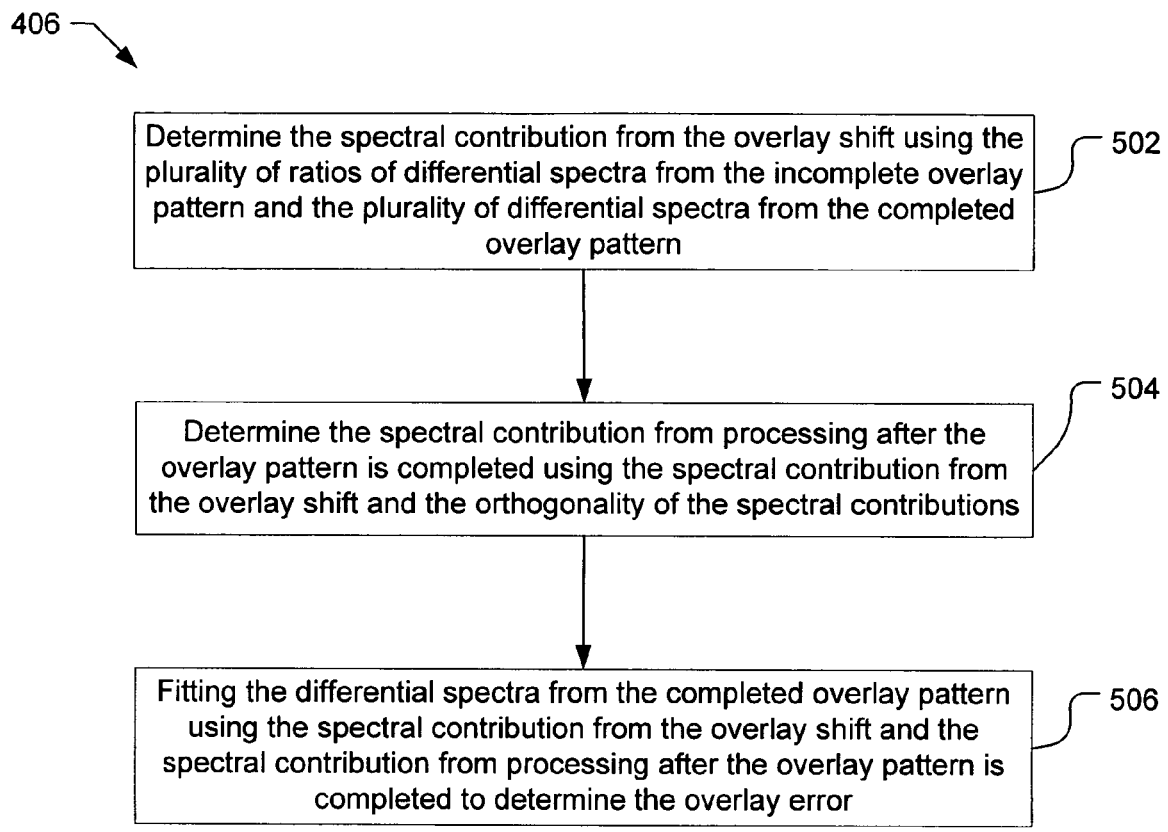
FIG. 8 is a flow chart that illustrates one embodiment of determining the overlay error from the plurality of ratios and differential spectra.

In another embodiment, the overlay error e can be determined by fitting the parameters. One embodiment of fitting, assumes the spectral contributions from the processing variations Q and the spectral contribution from the overlay shift Ovl are orthogonal, as discussed above. In accordance with the present invention, using the plurality of ratios and differential spectra to determine the overlay error e step 406 in FIG. 7 is further specified in FIG. 8. As illustrated in FIG. 8, the spectral contribution from the overlay shift Ovl (step 502) is determined from the plurality of ratios and the plurality of differential spectra. The spectral contribution from the overlay shift Ovl, can be determined from the following:

if $|S_4-S_3|>|S_1-S_2|$ $$(T_4 - T_3)\frac{S_1 - S_2}{S_4 - S_3} - (T_1 - T_2) = dOvl\left(\frac{S_1 - S_2}{S_4 - S_3} - 1\right) \text{ otherwise:} \quad \text{eq. 34}$$

$$(T_1 - T_2)\frac{S_4 - S_3}{S_1 - S_2} - (T_4 - T_3) = dOvl\left(\frac{S_4 - S_3}{S_1 - S_2} - 1\right). \quad \text{eq. 35}$$

The spectral contribution from processing after the overlay pattern is completed, i.e., Q, is also determined (step 504). From equation 26, the spectral contribution Q can be written as follows.

$$Q = \frac{T_1 - T_2 + T_3 - T_4}{E_1 - E_2 + E_3 - E_4} \quad \text{eq. 36}$$

The spectral contribution from processing Q is determined from equation 24 using the previously determined spectral contribution Ovl.

In step 506 in FIG. 8, the overlay error e is determined from fitting the differential spectra $T_4-T_1$ or $T_3-T_2$ using the derived spectral contributions Ovl and Q, while floating e and $E_4-E_1$ or $E_3-E_2$ in the following equations (from equation 18).

$$T_4-T_1=2eOvl+(E_4-E_1)Q$$

$$T_3-T_2=2eOvl+(E_3-E_2)Q \quad \text{eq. 37}$$

Using fitting to determine an unknown value is well known in the art. By way of example, one method of fitting is as follows. The equation to be fit may be written as $$S=aP+bQ \quad \text{eq.38}$$

where S, P, and Q are known spectra and a and b are floating variables. Determining a and b is equivalent to finding the minimum of the following:

$$F(a, b) = \sum_i (S_i - aP_i + bQ_i)^2. \quad \text{eq. 39}$$

Finding the minimum of equation 39 is as follows:

$$\frac{\partial F(a, b)}{\partial a} = \sum_i P_i(S_i - aP_i \pm bQ_i) = 0 \quad \text{eq. 40}$$

$$\frac{\partial F(a, b)}{\partial b} = \sum_i Q_i(S_i - aP_i \pm bQ_i) = 0$$

which may be written as:

$$\sum_i P_i S_i = a \sum_i P_i^2 + b \sum_i P_i Q_i \quad \text{eq. 41}$$

$$\sum_i Q_i S_i = a \sum_i P_i Q_i + b \sum_i Q_i^2.$$

Equation 41 may be rewritten as:

$$am_{11}+bm_{12}=c_1$$

$$am_{12}+bm_{22}=c_2 \quad \text{eq. 42}$$

where:

$$m_{11}=\Sigma P_i^2$$

$$m_{22}=\Sigma Q_i^2$$

$$m_{12}=\Sigma P_i Q_i$$

$$c_1=P_i S_i$$

$$c_2=\Sigma Q_i S_i \quad \text{eq. 43}$$

Thus, the terms a and b may be determined according to the following:

$$b = \frac{c_1 m_{12} - c_2 m_{11}}{m_{12}^2 - m_{11} m_{22}} \quad \text{eq. 44}$$

$$a = \frac{c_1 m_{22} - c_2 m_{12}}{m_{11} m_{22} - m_{12}^2}.$$

Alternatively, equation 38 may be solved with any regression method.

In another embodiment, the overlay error e can be found by direct fitting, where the spectral contributions Ovl and Q are again assumed to be orthogonal. Referring back to FIG. 7, in this embodiment, a plurality of differential spectra from the measurement locations of the completed overlay pattern 200' are generated (step 404 in FIG. 7), e.g., $$T_1-T_2=dOvl+(E_1-E_2)Q$$

$$T_4-T_3=dOvl+(E_4-E_3)Q$$

$$T_4-T_1=2eOvl+(E_4-E_1)Q$$

$$T_3-T_2=2eOvl+(E_3-E_2)Q. \quad \text{eq. 45}$$

Further, a plurality of ratios of differential spectra from measurement locations of the incomplete overlay pattern 200 are generated (step 402 in FIG. 7), i.e., $$\frac{S_i - S_j}{S_m - S_n} = \frac{E_i - E_j}{E_m - E_n} \qquad \text{eq. 46}$$

where i, j, m, and n are integers representing the pad numbers.

Using the plurality of ratios and the plurality of differential spectra from measurement locations of the completed overlay pattern, the overlay error e can be determined (step 406 in FIG. 7) by floating the terms e, Ovl, and Q and finding a best fit for all four equations in equation 45. As a result, the overlay error e can be solved. It should be understood that because both Ovl and Q are spectra, the fitting is performed for every wavelength, while making the overlay error e identical for all the wavelengths.

In yet another embodiment, the premeasurement of the spectra S from the overlay before the top grating is formed can be obviated with the careful design of the pads in the overlay pattern. Referring to FIG. 6, by way of example, two pads may have the same designed in offsets, e.g., $D_2=D_4$, while the other two pads have the same magnitude designed in offset but are in opposite directions, i.e., $D_1=-D_3$. Alternatively, the designed in offsets of the four pads may be symmetrical, such that there are two pairs of pads, each pair having the same magnitude designed in offset but in opposite directions, e.g., $D_1=-D_4$ and $D_2=-D_3$. Of course, if desired, additional pads may be used.

Where two pads have the same designed in offsets, the term cQ can be constructed directly from the measured spectra T obtained from these two pads without the use of a premeasurement. Where the four pads are symmetric, the term cQ can be constructed directly from the measured spectra T obtained from the four pads without the use of a premeasurement. Assuming orthogonality of Q and Ov, the terms e and Ovl can be then be determined from all spectra. In other words, the overlay error is determined using all the pads, while the overlay error is corrected for effects of local process variations using the detected radiation from the two pads in the former embodiment, and using the four pads in the later embodiment. It should be understood that the he correction of the overlay error for local process variations may be performed while determining the overlay error. Alternatively, the two acts may be performed separately if desired.

By way of example, based on the orthogonality which may be expressed as:

$$\Sigma Ovl_i \cdot Q_i = 0 \qquad \text{eq. 47}$$

equation 18 may be modified as follows:

$$(T_1-T_2)-(T_4-T_3)=(E_1-E_2+E_3-E_4)Q. \qquad \text{eq. 48}$$

Without losing generalities let i,j=1 … N. Equation 18 may be rewritten as follows:

$$(T_i-T_j)Q=dOvl \cdot Q+(E_i-E_j)Q \cdot Q=(E_i-E_j)Q \cdot Q. \qquad \text{eq. 49}$$

Thus, $$(E_1-E_2) = \frac{(T_1-T_2) \cdot Q}{Q \cdot Q} \qquad \text{eq. 50}$$

-continued $$(E_4-E_3) = \frac{(T_4-T_3) \cdot Q}{Q \cdot Q}$$

$$(E_4-E_1) = \frac{(T_4-T_1) \cdot Q}{Q \cdot Q}$$

$$(E_3-E_2) = \frac{(T_3-T_2) \cdot Q}{Q \cdot Q}$$

The term Ovl can then be evaluated, which can then be used to determine e. The term Q can be determined using equation 20.

Let $$C_1 = \frac{E_1-E_2}{E_4-E_3} = \frac{T_1-T_2}{T_4-T_3}; \qquad \text{eq. 51}$$

$$C_2 = \frac{E_4-E_1}{E_3-E_2} = \frac{T_4-T_1}{T_3-T_2}.$$

From equation 18:

$$(T_1-T_2)-C_1(T_4-T_3)=dOvl+(E_1-E_2)Q-C_1 dOvl-C_1(E_4-E_3)Q \qquad \text{eq. 52}$$

which with $C_1$ from equation 51 reduces to:

$$(T_1-T_2)-C_1(T_4-T_3)=dOvl+(E_1-E_2)Q-C_1 dOvl-(E_1-E_2)Q=(1-C_1)dOvl. \qquad \text{eq. 53}$$

Also, from equation 18:

$$(T_4-T_1)-C_2(T_3-T_2)=(1-C_1)2eOvl. \qquad \text{eq. 54}$$

Combining equation 53 and 54 results in:

$$\left(\frac{1-C_2}{1-C_1}\right)\frac{2e}{d} = \frac{(T_4-T_1)-C_2(T_3-T_2)}{(T_1-T_2)-C_1(T_4-T_3)} \qquad \text{eq. 55}$$

from which it can be seen e can be determined.

There are other ways of determining e from these equations. For example, combining equation 50 with equation 18 results in the following:

$$dOvl=(T_1-T_2)-(E_1-E_2)Q;$$

$$dOvl=(T_4-T_3)-(E_4-E_3)Q;$$

$$2eOvl=(T_4-T_1)-(E_4-E_1)Q; \text{ and}$$

$$2eOvl=(T_3-T_2)-(E_3-E_2)Q. \qquad \text{eq. 56}$$

All the items on the right side of equation 56 are known, and thus, e can be calculated.

Although the present invention is illustrated in connection with specific embodiments for instructional purposes, the present invention is not limited thereto. Various adaptations and modifications may be made without departing from the scope of the invention. For example, it should be understood that various equivalent ratios and equations may be used in accordance with the present invention. Moreover, the present invention is not limited to the precise overlay patterns described. For example, additional pads and/or different designed in offsets may be used. Therefore, the spirit and scope of the appended claims should not be limited to the foregoing description.

What is claimed is:

1. A method comprising:
providing an overlay pattern having a plurality of measurement locations, each measurement location includes a bottom diffraction grating and a top diffracting grating that overlies the bottom diffraction grating and has a designed in offset from the bottom diffraction grating, wherein at least two measurement locations in the overlay pattern differ from each other at least partially due to an unintentional local process variation created during processing of the overlay pattern;
illuminating each of the plurality of measurement locations of the overlay pattern with incident radiation that reacts with the diffraction gratings;
detecting the radiation from the measurement locations after reacting with the diffraction gratings;
determining a measurement of an overlay error between the bottom diffraction gratings and the top diffraction gratings using the detected radiation from the measurement locations from the overlay pattern; and
correcting the determined measurement of the overlay error for effects of the local process variations created during processing of the overlay pattern using the detected radiation from at least one pair of the measurement locations from the overlay pattern.

2. The method of claim 1, further comprising:
providing the overlay pattern having the plurality of measurement locations prior to depositing the top diffraction gratings over the bottom diffraction gratings, such that the overlay pattern is incomplete and each measurement location of the incomplete overlay pattern has a bottom diffraction grating;
illuminating each of the plurality of measurement locations of the incomplete overlay pattern with incident radiation that reacts with the bottom diffraction gratings; and
detecting the radiation from said plurality of measurement locations of the incomplete overlay pattern;
wherein determining the measurement of the overlay error uses the detected radiation from the measurement locations from the incomplete overlay pattern and the detected radiation from the measurement locations from the overlay pattern;
wherein correcting the determined measurement of the overlay error for effects of the local process variations uses the detected radiation from at least one pair of the measurement locations from the overlay pattern and the detected radiation from the incomplete overlay pattern.

3. The method of claim 2, wherein using the detected radiation from the measurement locations of the incomplete overlay pattern and the detected radiation from the measurement locations of the completed overlay pattern to determine the overlay error comprises:
generating a plurality of ratios of differential spectra from measurement locations of the incomplete overlay pattern;
generating a plurality of differential spectra from measurement locations of the completed overlay pattern;
using said plurality of ratios and said plurality of differential spectra to determine the measurement of the overlay error.

4. The method of claim 3 wherein using said plurality of ratios and said plurality of differential spectra comprises directly solving for the overlay error based on said plurality of ratios and said plurality of differential spectra.

5. The method of claim 3, wherein using said plurality of ratios and said plurality of differential spectra comprises curve fitting.

6. The method of claim 2, wherein the incomplete overlay pattern includes the local process variations.

7. The method of claim 1, wherein correcting the determined measurement of the overlay error for effects of the local process variations created during processing of the overlay pattern is performed while determining the overlay error.

8. The method of claim 1, wherein:
the overlay pattern has at least four measurement locations;
at least a first pair of the measurement locations have a designed in offset of a first magnitude and at least a second pair of the measurement locations have a designed in offset of a second magnitude; and
correcting the determined measurement of the overlay error for effects of the local process variations created during processing of the overlay pattern uses the detected radiation from the first pair of measurement locations that have the designed in offset of the first magnitude.

9. The method of claim 8, wherein the first pair of measurement locations have a designed in offset of the first magnitude in the same direction and the second pair of measurement locations have a designed in offset of the second magnitude in opposite directions.

10. The method of claim 8, wherein correcting the determined measurement of the overlay error for effects of the local process variations created during processing of the overlay pattern further uses the detected radiation from the second pair of measurement locations that have the designed in offset of the second magnitude.

11. The method of claim 10, wherein the first pair of measurement locations have a designed in offset of the first magnitude in opposite directions and the second pair of measurement locations have a designed in offset of the second magnitude in opposite directions.

12. The method of claim 1, wherein the local process variations cause the at least two measurement locations in the overlay pattern to differ from each other with respect to at least one of film thickness, grating height of the bottom diffraction grating and linewidth of the bottom diffraction grating.

13. A method comprising:
providing an overlay pattern having at least four measurement locations, each measurement location having a bottom diffraction grating and a top diffracting grating that overlies the bottom diffraction grating and has a designed in offset from the bottom diffraction grating, at least two pairs of the measurement locations have the same magnitude designed in offset wherein at least two measurement locations in the overlay pattern differ from each other at least partially due to an unintentional local process variation created during processing of the overlay pattern;
illuminating each of the measurement locations of the overlay pattern with incident radiation that reacts with the diffraction gratings;
detecting the radiation from the measurement locations after reacting with the diffraction gratings;
determining a measurement of an overlay error between the bottom diffraction gratings and the top diffraction gratings using the detected radiation from the measurement locations; and
correcting the determined measurement of the overlay error for effects of the local process variations created during processing of the overlay pattern using the detected radiation from at least one pair of the measurement locations from the overlay pattern.

14. The method of claim 13, wherein at least two of the measurement locations have the same magnitude designed in offset in opposite directions and at least two measurement locations have the same magnitude designed in offset in the same direction.

15. The method of claim 13, wherein a first pair of the measurement locations have a first magnitude designed in offset in opposite directions and a second pair of the measurement locations have a second magnitude designed in offset in opposite directions, wherein the first magnitude is different than the second magnitude.

16. The method of claim 13, wherein correcting the determined measurement of the overlay error for effects of the local process variations created during processing of the overlay pattern is performed while determining the overlay error.

17. The method of claim 13, wherein the local process variations cause the at least two measurement locations in the overlay pattern to differ from each other with respect to at least one of film thickness, grating height of the bottom diffraction grating and linewidth of the bottom diffraction grating.

* * * * *